US006821706B2

(12) United States Patent
Elian et al.

(10) Patent No.: US 6,821,706 B2
(45) Date of Patent: Nov. 23, 2004

(54) POLYMERIZABLE COMPOSITION, POLYMER, RESIST, AND PROCESS FOR ELECTRON BEAM LITHOGRAPHY

(75) Inventors: Klaus Elian, Erlangen (DE); Rafael Abargues, Erlangen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/627,906

(22) Filed: Jul. 25, 2003

(65) Prior Publication Data

US 2004/0081910 A1 Apr. 29, 2004

(30) Foreign Application Priority Data

Jul. 25, 2002 (DE) ......................................... 102 34 527

(51) Int. Cl.[7] ............................................. G03F 7/004
(52) U.S. Cl. ...................... 430/270.1; 430/5; 430/942; 430/330; 430/311; 430/314; 430/913; 430/914
(58) Field of Search .................... 430/270.1, 5, 913, 430/914, 311, 314, 330, 942; 526/72, 256

(56) References Cited

PUBLICATIONS

Jousselme et al.: "Electrochemical Synthesis of C60–Derivatized Poly(thiophene)s from Tailored Precursors", Macromolecules 2003 (36), pp. 3020–3025.*
Maggie A.Z. Hupcey et al. :"Positive–tone Conducting E–Beam resists", SPIE, vol. 3048, pp 100–104.*
Maggie A.Z. Hupcey et al.: "Positive–tone Conducting E–beam Resists", *SPIE, vol. 3048, pp. 100–104*.

* cited by examiner

Primary Examiner—Amanda Walke
(74) Attorney, Agent, or Firm—Laurence A. Greenberg; Werner H. Stemer; Ralph E. Locher

(57) ABSTRACT

A polymerizable composition for use in electron beam lithography, according to the following structural formula:

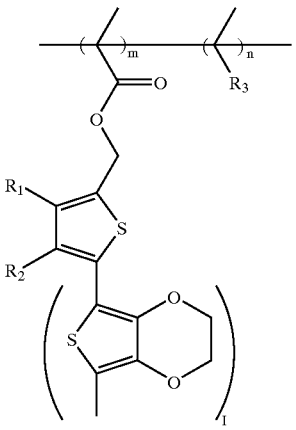

The formula use the following definitions. m is a number from 0.1 to 0.9. n is a number from 0.1 to 0.9 with m+n=1. I is an integer from 1 to 100. $R_1$ is H, an alkyl, a halogen, an amine, a silicon compound, or a germanium compound, having a chain length of up to six carbon, silicon, or germanium atoms. $R_2$ is H, an alkyl, a halogen, an amine, a silicon group, or a germanium compound, having a chain length of up to six carbon, silicon, or germanium atoms. $R_3$ is an organic protective group which can be eliminated. A resist and a process using the resist utilize the polymerizable composition. The use of the polymerizable composition in a resist reduces or prevents charging of a substrate at high exposure sensitivity.

21 Claims, 1 Drawing Sheet

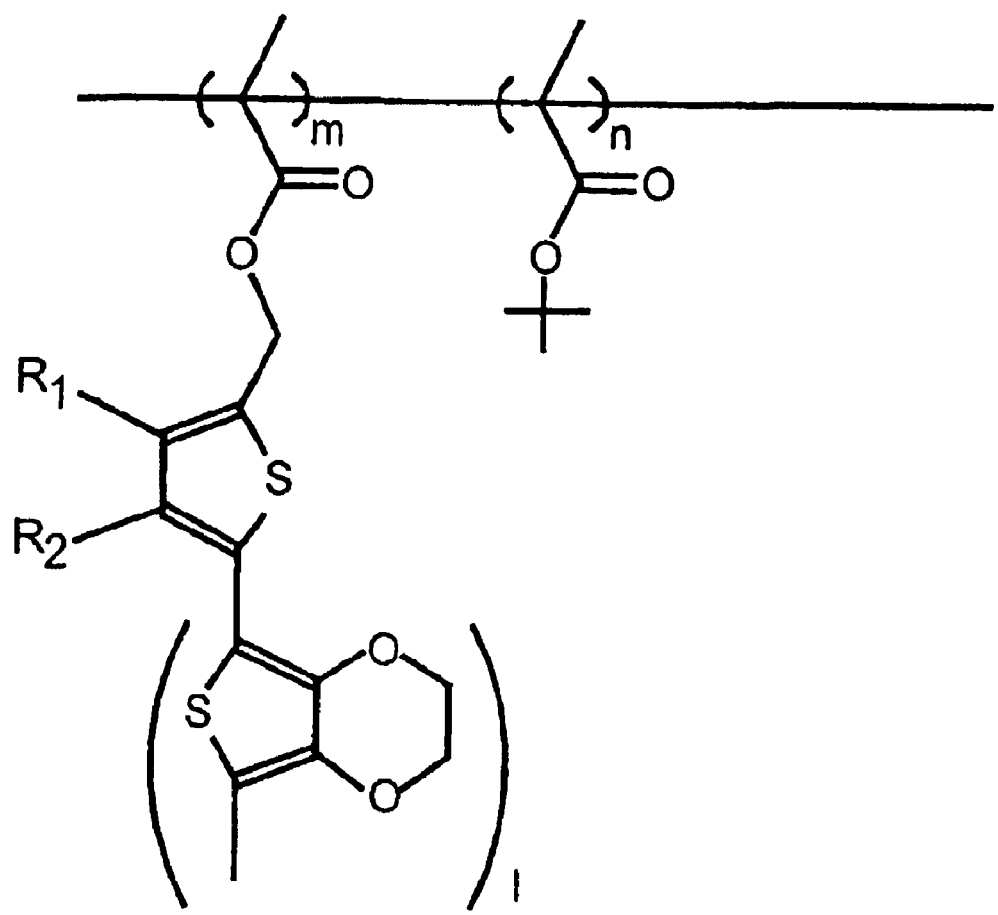

POLYMERIZABLE COMPOSITION, POLYMER, RESIST, AND PROCESS FOR ELECTRON BEAM LITHOGRAPHY

BACKGROUND OF THE INVENTION

Field of the Invention

The invention relates to a polymerizable composition, a polymer, a resist, and a process for electron beam lithography.

In addition to the development of increasingly fine lithography techniques for wafer structuring, the development of such techniques for mask production is also playing a more and more important role in the production of semiconductor components. For the masks that, as a rule, include a quartz glass substrate with applied chromium layer (CoG: chrome on glass), electron beam lithography is now being used increasingly frequently for structuring the chromium.

For this purpose, the mask is coated with a resist (photoresist) that is then exposed in a targeted manner to an electron beam (i.e. structured) in a mask recorder and then developed. In a subsequent etching step, the chromium on the mask is removed from the parts now no longer protected by the photoresist, and the lithography mask is complete. The problems occurring in the production of the lithography mask are described briefly below.

In spite of a reduction factor of four or five times (4 or 5×), the structures to be imaged on the masks are now so small that the laser recorders already used to date have to be increasingly replaced by higher-resolution electron beam recorders.

By introducing the OPC (optical proximity correction), auxiliary structures have to be integrated into the mask layout. The structures are substantially smaller than the structural elements to be imaged.

PSM (phase shift mask) technology has particular requirements for mask production since in this case additional layers have to be applied to the mask or the substrate has to be ablated in a defined manner in order to achieve the desired phase jumps. At the same time, there is currently no process for PSM mask production that records both levels by using electron beam lithography mask recorders. The second level has been optically recorded to date. A reason for this is the poor charge conduction in the resist; by recording on the resist by using an electron beam, the mask is negatively charged during the recording process, which is generally referred to as charging.

In phase shift mask production, two separate lithography steps are required, the charging problem occurring in the second step.

In the first step, the chromium layer of the mask is structured, suitable earthing of the mask blank in the mask recorder making it possible to still conduct away the resulting negative electrical charge of the mask without problems.

In the second lithography step, applied resist must be recorded on by using (exposed to) electron beams again, but now on an already incomplete (prestructured) chromium layer. Owing to the interrupted chromium layer, the charge can no longer be conducted away over the whole surface by earthing; the mask blank builds up a negative charge during the recording process. However, this negative charge build-up influences the electron beam, incident on the sample, in the mask recorder, which is required both for recording and for adjustment control. This influence leads to undesired deflection and divergence of the electron beam, which is troublesome particularly during adjustment but also leads to undesired distortions and recording errors during recording of the second lithography plane of the phase shift masks.

Solving the problem of charging with a copolymer blend or a blend of an insulating polymer and a conductive polymer is known from an article by M. A. Z. Hupcey, C. K. Ober (SPIE Vol. 3048, pages 100–104). However, these blends have too low an exposure sensitivity, which leads to an undesired increase in the recording times. Furthermore, the development processes are expensive.

Because the problem is acute in particular for the future 75 nm node, there is at present no fixed potential solution for production. Testing of the use of additional, separate conductive resists in the context of a two-layer system is known. The mask blank is first coated with a commercial structurable Ebeam resist, on which a separate layer of a nonstructurable, conductive organic resist which is intended to serve for the necessary charge removal is applied in a second step. This additional resist layer is then completely detached together with the exposed or unexposed parts of the Ebeam resist in the development process following the structuring, with the result that the mask blank thereafter contains only the desired Ebeam resist structures.

However, in addition to the application of the Ebeam resist, an additional coating step is required. The additional step complicates the overall process. The reason is the very expensive (particles, uniformity, additional undesired process times, delay time, stability problems) and risky coating of mask blanks generally. In contrast to wafer production (round wafers), the square mask blanks are substantially more complicated to coat, and it is for this reason that any additional avoidable coating process is avoided in mask production.

All possible approaches known to date for realizing a conductive resist failed to meet the criteria of the high resolution required and high exposure sensitivity, so that no material which meets the present day and future production requirements has as yet been proposed.

SUMMARY OF THE INVENTION

It is accordingly an object of the invention to provide a polymerizable composition, a polymer, a resist, and a process for electron beam lithography that overcome the hereinafore-mentioned disadvantages of the heretofore-known devices of this general type and that solves or at least reduces the charging problem and at the same time has high exposure sensitivity.

With the foregoing and other objects in view, there is provided, in accordance with the invention, a polymerizable composition for use in electron beam lithography. The polymerizable composition has the following structural formula:

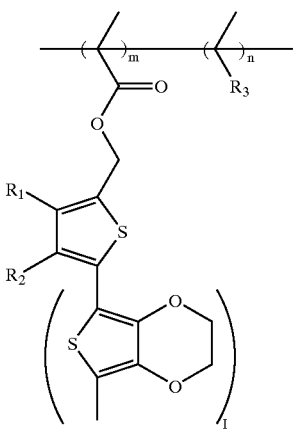

In the formula, m is a first number from 0.1 to 0.9. n is a second number from 0.1 to 0.9 with m+n=1. l is an integer from 1 to 100. $R_1$ is a first substituent that can be H, an alkyl, a halogen, an amine, a silicon compound, or a germanium compound. The first substituent can have a chain length of up to six carbon, silicon, or germanium atoms. $R_2$ is a second substituent that can be H, an alkyl, a halogen, an amine, a silicon compound, or a germanium compound. The second substituent has a chain length of up to six carbon, silicon, or germanium atoms. $R_3$ is an eliminatable organic protective group.

Compared with the two necessary coating processes described in the prior art, it is possible with the polymerizable composition according to the invention to manage with a single coating process. The resulting resist already has the necessary electrical conductivity in addition to easy structurability. The production process is thus substantially simplified and the costs are reduced.

A resist according to the invention is, for example, applied directly to the chromium-structured layer of a lithography mask and thus ensures that charge is optimally conducted away, while the additional conductive resist layer used in the abovementioned prior art permits no contact of the chromium but can only remove the surface charge. With the resist according to the invention, charge can thus be better conducted away.

Other features that are considered as characteristic for the invention are set forth in the appended claims.

Although the invention is illustrated and described herein as embodied in a polymerizable composition, a polymer, a resist, and a process for electron beam lithography, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE is a chemical formula of a functional polymer including two comonomers.

DESCRIPTION OF THE PREFERRED EMBODIMENTS

Referring now to the single FIGURE of the drawing, it is seen that an embodiment of the polymerizable composition is used in a material composition that includes the functional polymer shown, an electron-sensitive component (PAG, photo acid generator), and a solvent. This is analogous to the composition of customary chemically amplified resists.

The functional polymer includes at least two components, of which, one serves as an acid-cleavable dissolution inhibitor (on the right in FIG. 1, n) and the second guarantees the electrical conductivity (on the left in FIG. 1, m). In the formula, the variables have the following meaning:

m=from 0.1 to 0.9;

n=from 0.1 to 0.9 with m+n=1;

l=from 1 to 100;

$R_1$=H, alkyl, halogens, amines, silicon, or germanium compounds, having a chain length of up to six carbon, silicon, or germanium atoms; and $R_2$=H, alkyl, halogens, amines, silicon or germanium compounds having a chain length of up to six carbon or silicon or germanium atoms.

The following resist mixture is prepared using this polymer:

70–98% of solvent (e.g. methoxypropyl acetate, ethyl acetate, ethyl lactate, cyclohexanone, gamma-butyrolactone, methyl ethyl ketone);

2–30% of functional polymer 0.1–10% of photo acid generator (e.g. Crivello salts, triphenylsulfonium sulfonates, diphenyliodonium sulfonates, phthalimido-sulfonates, ortho-nitrobenzyl sulfonates)

A resist that can be used, in particular in the production of masks by using electron beam lithography, is obtained by polymerization. A typical lithography process using the resist according to the invention is as follows:

1. Coating of a mask blank with the abovementioned resist solution;

2. Recording on the resist by using an electron beam recorder;

3. If required, a subsequent heating step;

4. Development of the recorded resist with an aqueous alkaline developer medium (e.g. 2.38% strength aqueous tetramethylammonium hydroxide solution, standard TMAH developer);

5. Dry etching of the blank in a reactive ion plasma (RIE) with a chlorine/oxygen gas mixture. The chromium layer is etched; the photoresist is substantially not attacked; the structure originally recorded is transferred to the chromium.

In principle, it is also possible to use other etching processes for structuring the substrate. Furthermore, the use of the resist according to the invention is not limited to the production of CoG masks.

EXAMPLE 11.42 g of thiophene-2-methanol (for example, available from Merck) are dissolved in 100 ml of pyridine and cooled to 0° C. by cooling the reaction vessel with ice. 10.45 g of methacryloyl chloride are added dropwise thereto in the course of 1 h. The mixture is then warmed up to room temperature and stirred overnight. The mixture is poured into ice water and slightly acidified with HCl. The oily ester which separates out is washed with aqueous bicarbonate solution and separated as [product 1].

If [product 1] is dissolved in 100 ml of methyl ethyl ketone and heated to the boil and a mixture of 14.2 g of tert-butyl methacrylate and 100 ml of methyl ethyl ketone is added dropwise thereto in the course of 2 h, the mixture polymerizes and, after cooling and dropwise addition to 2 l of water, gives a virtually colorless polymer, which is filtered off and is dried as [product 2] in a vacuum drying oven at 50° C.

5 g of [product 2] are in turn dissolved in 70 ml of methyl ethyl ketone, and a mixture of 5 g of anhydrous iron(III) chloride, 5 g of 3,4-ethylenedioxythiophene and 40 ml of methyl ethyl ketone is added at room temperature in the course of 15 min. The reaction mixture is then immediately added to 2 l of ice water with vigorous stirring, and the dark brown polymer obtained is filtered off and is dried as [product 3], once again in a vacuum drying oven at 50° C.

[Product 3] is used to prepare a resist solution 1, consisting of 7.2% by weight of [product 3], 0.8% by weight of triphenylsulfonium hexafluoropropanesulfonate and 92% by weight of methoxy-2-propyl acetate.

The following lithography process is carried out using the resist obtained in this manner:

1. Provision of a commercial 6 inch CoG mask blank ("chrome on glass", quartz glass plate with a chromium layer applied by sputtering or vapor deposition). This may be a raw blank or may already contain a prestructured chromium layer.

2. Coating of this blank with the resist solution 1.

3. Heating step (e.g. 120° C. for 120 s) for drying this resist layer. During this procedure, the major part of the coating solvent evaporates, resulting in a strong, dry resist film having, for example, a layer thickness of 0.25 μm on the mask blank.

4. Recording on the coated mask blank by using an electron beam mask recorder (e.g. ETEC MEBES series).

5. Heating step (postexposure bake) (e.g. 120° C. for 120 s) for fixing the latent recorded image in the resist layer.

6. Treatment of the complete mask blank with an aqueous alkaline developer solution (e.g. 2.38% tetramethylammonium hydroxide in water) for, for example, 60 s. During this development step, the recorded part of the resist layer is dissolved away and removed.

7. Plasma etching of the complete mask blank for structuring the chromium layer or etching of the quartz glass substrate. This is likewise effected in a reactive ion plasma.

The invention is not limited in its implementation to the abovementioned preferred examples. Rather, there is a number of conceivable variants which make use of the polymerizable composition according to the invention, the resist and the process also in embodiments of fundamentally different types.

We claim:
1. A polymerizable composition for use in electron beam lithography having a structural formula:

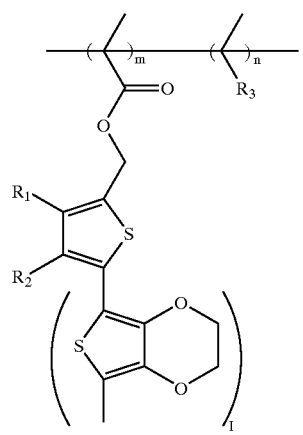

wherein
m is a first number from 0.1 to 0.9;
n is a second number from 0.1 to 0.9 with m+n=1;
I is an integer from 1 to 100;
$R_1$ is a first substituent selected from the group consisting of H, an alkyl, a halogen, an amine, a silicon compound, and a germanium compound, said first substituent having a chain length of up to six carbon, silicon, or germanium atoms;
$R_2$ is a second substituent selected from the group consisting of H, an alkyl, a halogen, an amine, a silicon compound, and a germanium compound, said second substituent having a chain length of up to six carbon, silicon, or germanium atoms; and
$R_3$ is an eliminatable organic protective group.

2. The polymerizable composition according to claim 1, wherein $R_1$, $R_2$, and $R_3$ are identical.

3. The polymerizable composition according to claim 1, wherein $R_1$, $R_2$, and $R_3$ are different.

4. The polymerizable composition according to claim 1, wherein $R_3$ is an organic protective group eliminatable by acid.

5. The polymerizable composition according to claim 4, wherein said structural formula is:

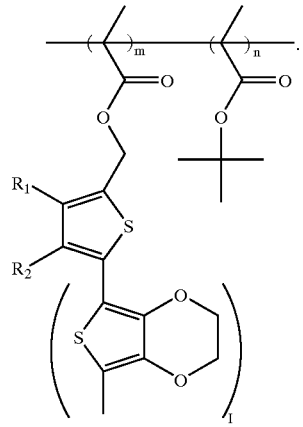

6. The polymerizable composition according to claim 5, wherein $R_1$ and $R_2$ are identical.

7. The polymerizable composition according to claim 5, wherein $R_1$ and $R_2$ are different.

8. The polymerizable composition according to claim 1, wherein $R_3$ includes a functional group selected from the group consisting of a tert-alkyl ester group, a tert-butoxycarbonyloxy group, an acetal group, a tetrahydrofuranyl group, and a tetrahydropyranyl group.

9. The polymerizable composition according to claim 8, wherein $R_3$ includes a tert-butyl ester.

10. The polymerizable composition according to claim 1, further comprising a unit selected from the group consisting of a ter-polymer and a quarterpolymer.

11. A polymer comprising said polymerizeable composition according to claim 1.

12. A resist, comprising:
said polymer according to claim 11;
an organic solvent and; and
an additive being at least one of photosensitive and electron beam-sensitive.

13. The resist according to claim 12, wherein:
said polymer forms from 2 to 30% of the resist;
said solvent forms from 70 to 98% of the resist; and
a photo acid generator forms from 0.1 to 10% of the resist.

14. The resist according to claim 12, wherein said organic solvent is selected from the group consisting of methoxypropyl acetate, ethyl acetate, ethyl lactate, cyclohexanone, gamma-butyrolactone, and methyl ethyl ketone.

15. The resist according to claim 13, wherein said photo acid generator is selected from the group consisting of a Crivello salt, triphenylsulfonium sulfonate, diphenyliodonium sulfonate, phthalimidosulfonate, and ortho-nitrobenzyl sulfonate.

16. The resist according to claim 12, further comprising at least one of 50 to 98% of 1-methoxy-2-propane sulfonate and 0.1 to 10% of triphenylsulfonium hexafluoropropanesulfonate.

17. The resist according to claim 12 for use in an electron beam recording process.

18. A lithography process for producing a structure on a substrate, which comprises using the resist according to claim 12.

19. The lithography process according to claim 18, wherein the structure is a lithography mask for producing a semiconductor component.

20. The lithography process according to claim 18, which further comprises:

a) coating a mask blank with the resist according to claim 12;

b) recording the resist by using an electron beam recorder;

c) developing the structure in the resist; and d) dry-etching the mask blank.

21. The lithography process according to claim 18, further comprising heating the resist after recording on the resist.

* * * * *